(12) United States Patent
Ando et al.

(10) Patent No.: US 7,602,504 B2
(45) Date of Patent: Oct. 13, 2009

(54) EXPOSURE APPARATUS AND DEVICE MANUFACTURING METHOD

(75) Inventors: Miwako Ando, Utsunomiya (JP); Yoshinori Ohsaki, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 87 days.

(21) Appl. No.: 12/059,444

(22) Filed: Mar. 31, 2008

(65) Prior Publication Data

US 2008/0259349 A1    Oct. 23, 2008

(30) Foreign Application Priority Data

Apr. 18, 2007  (JP) .............................. 2007-109576

(51) Int. Cl.
*G01B 11/02* (2006.01)
(52) U.S. Cl. ..................................... 356/515
(58) Field of Classification Search ................. 356/489, 356/495, 511, 512, 515
See application file for complete search history.

(56) References Cited

U.S. PATENT DOCUMENTS

| | | |
|---|---|---|
| 6,614,535 B1 | 9/2003 | Kakuchi et al. |
| 7,023,561 B2 | 4/2006 | Kakuchi et al. |
| 7,236,254 B2 | 6/2007 | Kakuchi et al. |
| 7,382,446 B2 * | 6/2008 | Morohoshi .................... 355/53 |
| 2001/0010886 A1 * | 8/2001 | Kamon ......................... 355/53 |
| 2002/0015158 A1 * | 2/2002 | Shiode et al. ................ 356/614 |
| 2002/0036762 A1 * | 3/2002 | Nishi ........................... 355/53 |
| 2003/0128346 A1 * | 7/2003 | Murakami et al. ............ 355/53 |
| 2004/0036883 A1 * | 2/2004 | Murakami et al. ........... 356/450 |
| 2005/0024612 A1 * | 2/2005 | Hirukawa et al. ............. 355/55 |
| 2006/0061757 A1 | 3/2006 | Yamamoto et al. |
| 2007/0188726 A1 * | 8/2007 | Shimizu et al. ............... 355/55 |
| 2007/0273854 A1 * | 11/2007 | Nagasaka ..................... 355/46 |

FOREIGN PATENT DOCUMENTS

| | | |
|---|---|---|
| JP | 2000-277412 A | 10/2000 |
| JP | 2004-273748 A | 9/2004 |
| JP | 2006-086344 A | 3/2006 |

* cited by examiner

*Primary Examiner*—Patrick J Connolly
(74) *Attorney, Agent, or Firm*—Canon U.S.A., Inc. I.P. Division (57) ABSTRACT

An exposure apparatus, which equipped with a projection optical system that is configured to project a pattern of an original onto a substrate, includes an interferometer configured to measure a wavefront in a first direction and a wavefront in a second direction of light passed through the projection optical system; a focus detecting unit configured to detect focus positions in the first and second directions of the projection optical system; and a calculating unit configured to calculate wavefront aberration of the projection optical system on the basis of the measurement result of the interferometer and the detection result of the focus detecting unit.

9 Claims, 12 Drawing Sheets

EXPOSURE APPARATUS AND DEVICE MANUFACTURING METHOD

BACKGROUND OF THE INVENTION

1. Field of the Invention

The present invention relates to exposure apparatuses and device manufacturing methods.

2. Description of the Related Art

For manufacturing devices such as semiconductor devices and liquid crystal devices by photolithography, projection exposure apparatuses that transfer patterns formed on reticles onto wafers by exposure are used. Generally, a projection exposure apparatus needs to accurately project a pattern of a reticle onto a wafer at a predetermined magnification. Therefore, a projection exposure apparatus requires a projection optical system with a high image forming capability and low aberration. Due to a demand for miniaturization of semiconductor devices in recent years, such requirement is increasing. For this reason, there is a demand for the ability to measure the wavefront aberration of a projection optical system with high accuracy in a state where the projection optical system is installed on the exposure apparatus body.

To fulfill this demand, there has been proposed an exposure apparatus equipped with an interferometer used for measuring wavefront aberration of a projection optical system. Examples of such an exposure apparatus are disclosed in Japanese Patent Laid-Open Nos. 2000-277412, 2004-273748, and 2006-086344. As an interferometer, a line diffraction interferometer (which will be referred to as an "LDI" hereinafter) or a shearing interferometer can be used.

Figure 9:
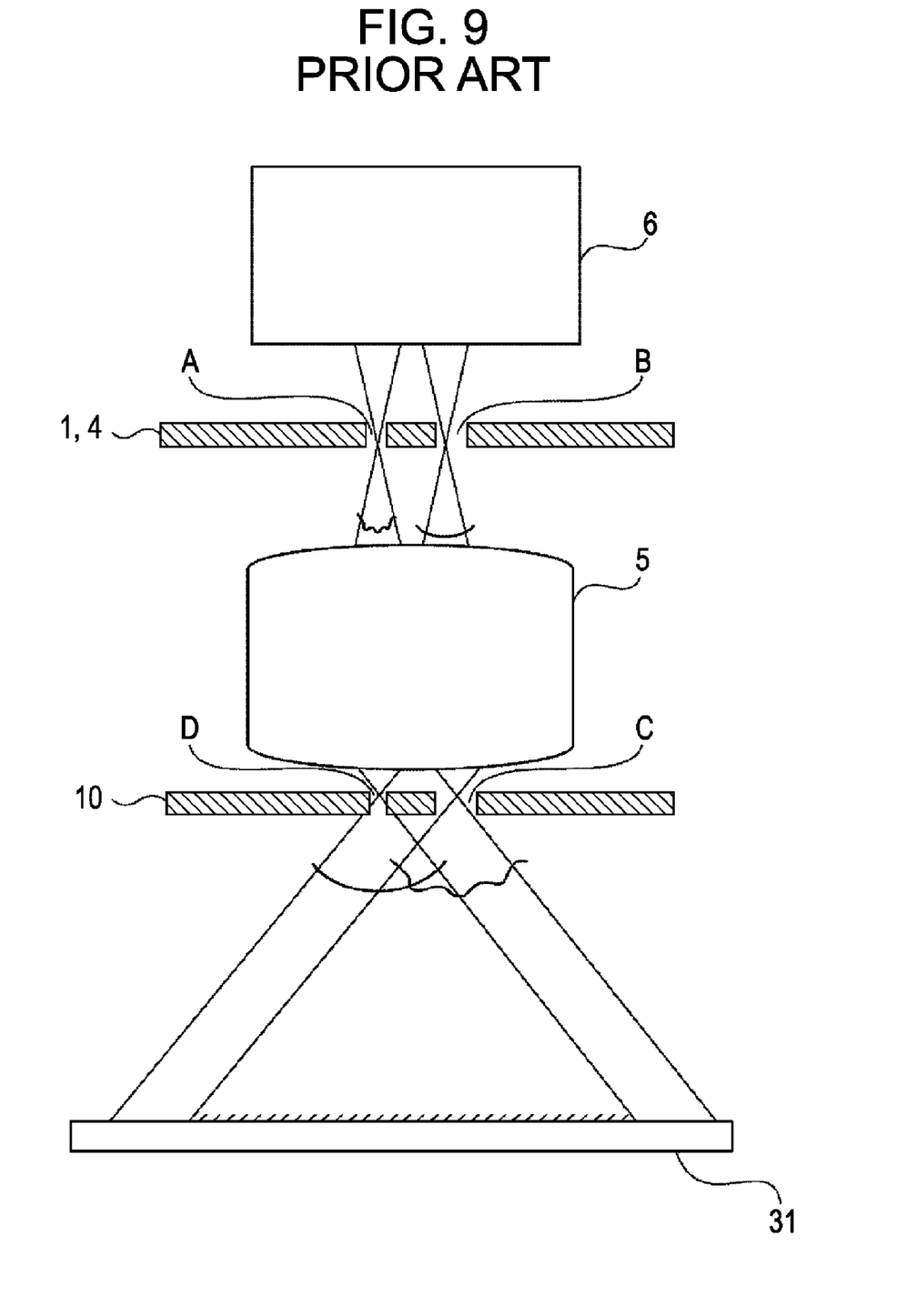
FIG. 9 is a schematic diagram of an LDI equipped in an exposure apparatus.
Figure 10A:
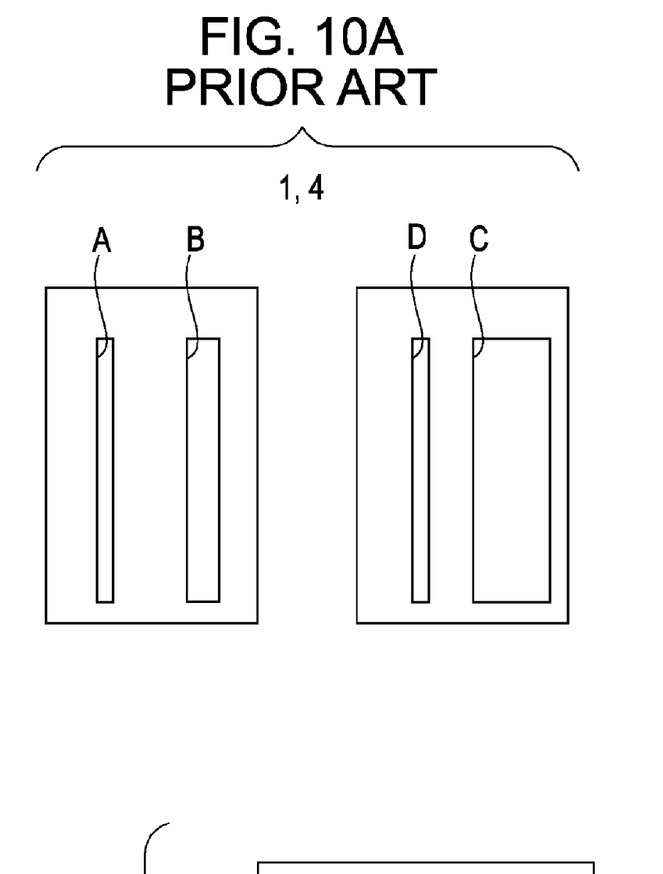
FIGS. 10A and 10B are top views of LDI marks (slit patterns) in FIG. 9.

An LDI will be described below with reference to FIG. 9. FIG. 9 is a schematic diagram of an LDI equipped in an exposure apparatus. A reticle 1 disposed at an object-plane side of a projection optical system 5 or a reticle reference plate 4 provided on a reticle stage has two parallel slit patterns (slit A and slit B) arranged adjacent to each other as shown in FIG. 10A. At least one of the slits, i.e. slit A in this case, is given a width that is set smaller than or equal to the resolution at the object-plane side of the projection optical system 5. In other words, if the numerical aperture at the object-plane side of the projection optical system 5 is represented by na and the wavelength of exposure light is represented by λ, a width w of the slit A is set so as to satisfy the condition: w≦0.5×λ/na. When an illuminator 6 illuminates the slits A and B with exposure light, the light released from the slit A will have a wavefront with no aberration with respect to the lateral direction of the slit A. On the other hand, the slit B may have the same line width as the slit A or may have a line width greater than that of the slit A. If the line width of the slit B is set greater than the resolution, the light released from the slit B will have a wavefront affected by aberration of an illumination optical system of the illuminator 6. The slits are given a length that can be considered that the aberration of the projection optical system 5 is the same between the two, or in other words, a length that is shorter than an isoplanatic area. The two slits are separated from each other by a distance shorter than the isoplanatic area.

Since the light rays released from the slits A and B pass through the projection optical system 5, the wavefronts thereof are affected by the aberration of the projection optical system 5. The images of the slits A and B are formed on a wafer reference plate 10 disposed on an image plane of the projection optical system 5. The wafer reference plate 10 is provided with a slit C and a slit D. The slit C is disposed at a position corresponding to the image of the slit A, whereas the slit D is disposed at a position corresponding to the image of the slit B. The slit D is given a width that is set smaller than or equal to the resolution at an image-plane side of the projection optical system 5. In other words, if the numerical aperture at the image-plane side of the projection optical system 5 is represented by NA and the wavelength is represented by λ, a width W of the slit D is set so as to satisfy the condition: W≦0.5×λ/NA. A wavefront of light focused on the slit D is affected by the aberration of the projection optical system 5 and the aberration of the illuminator 6 depending on the line width of the slit B. However, since the light focused on the slit D passes through the slit D, the light is shaped to have a wavefront with no aberration with respect to the lateral direction of the slit D. On the other hand, the line width of the slit C is greater than the resolution of the projection optical system 5 and is preferably greater than or equal to ten times the wavelength of exposure light and lower than or equal to hundred times the wavelength of exposure light. A wavefront of light focused on the slit C is affected only by the aberration of the projection optical system 5 with respect to the lateral direction of the slit C. Since the line width of the slit C is sufficiently large, the light released from the slit C will have a wavefront affected only by the aberration of the projection optical system 5.

Figure 10B:
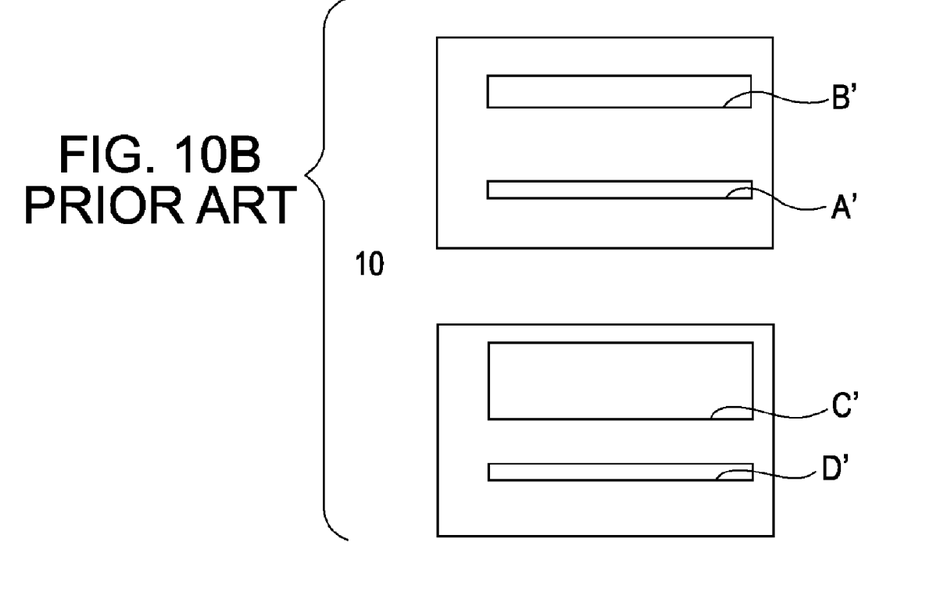

The light released from the slit C and the light released from the slit D are caused to interfere with each other, thereby forming interference fringes. These interference fringes are picked up by an image pickup element 31 such as a CCD sensor, thereby obtaining a wavefront of the projection optical system 5 (i.e. a wavefront in a first direction) with a proper correlation in a direction orthogonal to the longitudinal direction of the slits. Using slits A' to D' extending orthogonally to the longitudinal direction of the slits A to D as shown in FIG. 10B, a wavefront in a second direction can be similarly obtained. The wavefront (synthesized wavefront) of the projection optical system 5 can be determined by using the wavefronts (first-order wavefronts) in the first and second directions.

Figure 11A:
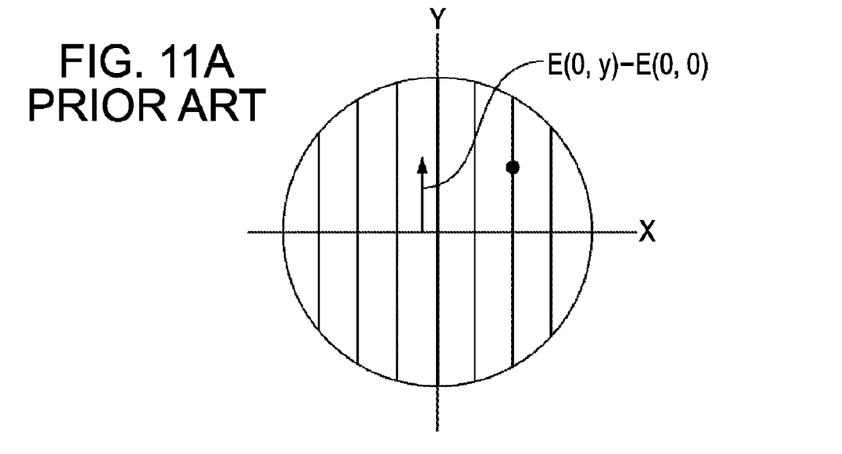
FIGS. 11A to 11C illustrate first-order wavefronts and synthesized wavefront.
Figure 11B:
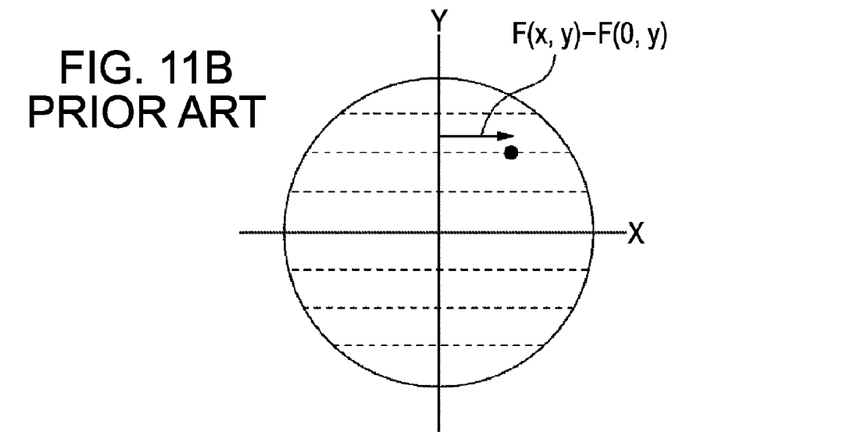
Figure 11C:
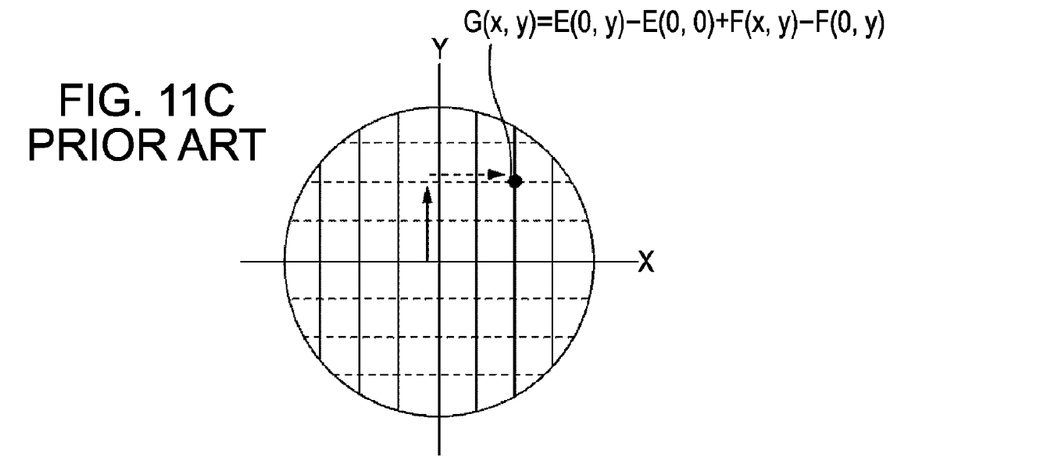

A method for determining a wavefront of the projection optical system 5 from two first-order wavefronts will be described with reference to FIGS. 11A to 11C. FIG. 11A shows a first-order wavefront E with a proper correlation in the Y-axis direction. FIG. 11B shows a first-order wavefront F with a proper correlation in the X-axis direction. FIG. 11C shows a wavefront G of the projection optical system 5. The phase correlation of lines parallel to the Y axis in the wavefront E is equal to the phase correlation of lines parallel to the Y axis in the wavefront G. Moreover, the phase correlation of lines parallel to the X axis in the wavefront F is equal to the phase correlation of lines parallel to the X axis in the wavefront G. Based on these relationships, a phase of an arbitrary point G(x,y) on the wavefront G is determined as phase-change amounts along two arrows in FIG. 11C, and is expressed as follows:

$$G(x,y)=E(0,y)-E(0,0)+F(x,y)-F(0,y)$$

Consequently, the wavefront G of the projection optical system 5 can be obtained from the two first-order wavefronts E and F.

Figure 12:
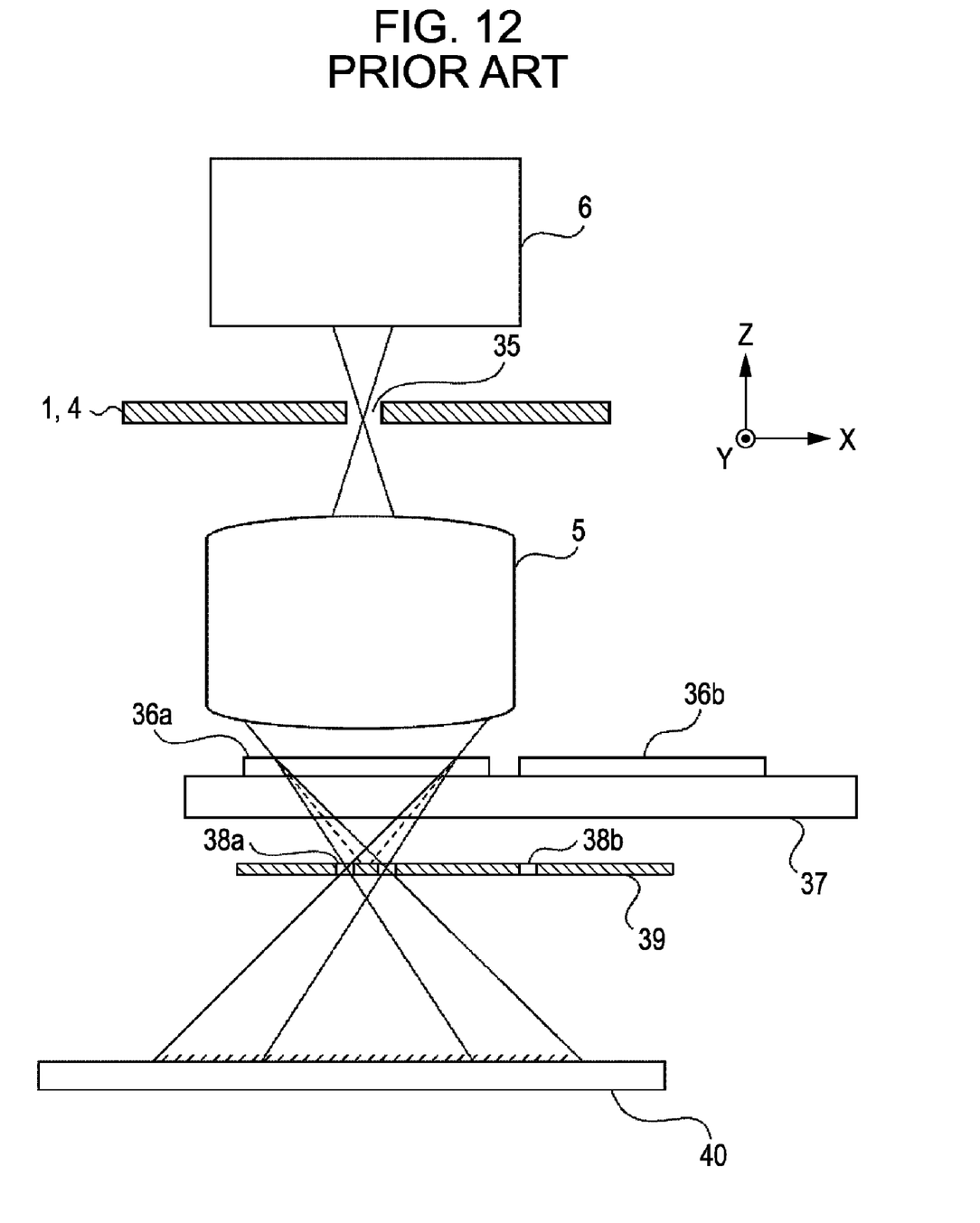
FIG. 12 is a schematic diagram of a shearing interferometer equipped in an exposure apparatus.

A shearing interferometer will be described below with reference to FIG. 12. FIG. 12 is a schematic diagram of a lateral shearing interferometer whose shear direction extends in a lateral direction (which is orthogonal to the optical axis). The interferometer includes a diffraction grating holding member 37 which supports diffraction gratings 36a and 36b. In this shearing interferometer, a spherical wave released from a spot on the object plane of the projection optical system 5 is made to enter the projection optical system 5. Specifically, the reticle 1 or the reticle reference plate 4 on the reticle stage is provided with a pin hole 35 as a first mark, and the illuminator 6 illuminates the pin hole 35 to generate this spherical wave. The light transmitted through the pin hole 35 passes through the projection optical system 5, which is a subject for measurement, and is split into a plurality of diffracted light rays by diffraction grating 36a disposed between the projection optical system 5 and the image plane of the projection optical system 5. The wavefronts of these diffracted light rays all have a shape that is the same as the shape of the wavefront of the light prior to being split by the diffraction grating 36a. Of the plurality of diffracted light rays, an order selection window 38a transmits only two diffracted light rays used for measurement. The two diffracted light rays transmitted through the order selection window 38a, formed in wafer reference plate 39, form interference fringes that are arranged in the same direction as the direction in which the gratings of the diffraction grating 36a are arranged on an image pickup element 40. A first-order wavefront in the first direction is calculated from these interference fringes. In this case, the order selection window 38a used transmits positive (+) first order and negative (−) first order diffracted light rays but blocks zero-th order diffracted light. The image pickup area of the image pickup element 40 is disposed at a conjugate position with respect to the pupil plane of the projection optical system 5.

Subsequently, the order selection window 38a and the diffraction grating 36a are switched respectively to an order selection window 38b and a diffraction grating 36b having gratings arranged in a direction orthogonal to the direction in which the gratings of the diffraction grating 36a are arranged. Then, a first-order wavefront in the second direction is similarly calculated. From these two wavefronts, the wavefront of the projection optical system 5 is calculated.

In wavefront measurement using an LDI, first-order wavefronts of a projection optical system with proper correlations are determined in two directions and are synthesized in order to calculate the wavefront of the projection optical system. If the positions (Z-axis positions) of slit patterns differ from each other in the optical-axis direction of the projection optical system at the time of the measurement of a first-order wavefront in the first direction and the measurement of a first-order wavefront in the second direction, there will be a significant error.

When using two first-order wavefronts whose first direction and second direction are orthogonal to each other, there is an error in a 2θ component having a protrusion (or a depression) for the first direction and a depression (or a protrusion) for the second direction. In this case, an amount of error $E_{2\theta}$ in the 2θ component is expressed as follows:

$$E_{2\theta} = dz \times (1 - sqrt(1-NA^2))/2 \times \lambda)$$

where dz represents a Z-axis-positional difference in the slit patterns at the time of the measurement of a first-order wavefront in the first direction and the measurement of a first-order wavefront in the second direction, λ represents the wavelength of exposure light, and NA represents the numerical aperture of the projection optical system. In an exposure apparatus where λ=193 nm and NA=0.9, when dz=1 nm, $E_{2\theta}$ is 1.5 mλ. In other words, even if there is an error of 1 nm in the Z-axis direction, it is still considered that an error of 1.5 mλ will be generated, which is a significant error factor in the LDI measurement. In a projection optical system with a higher NA, the amount of error will be even greater.

This problem is seen not only in a wavefront measurement method that employs an LDI, but can also be seen in a wavefront measurement method where a synthesized wavefront is calculated from first-order wavefronts in two or more directions (such as a wavefront measurement method that employs the aforementioned shearing interferometer).

Accordingly, it would be advantageous to provide an exposure apparatus equipped with a projection optical system that projects a pattern of an original onto a substrate, and method of operating the apparatus, which is not subject to the aforementioned disadvantages described above.

SUMMARY OF THE INVENTION

An exposure apparatus according to an aspect of the present invention is equipped with a projection optical system that is configured to project a pattern of an original onto a substrate. The exposure apparatus includes an interferometer configured to measure a wavefront in a first direction and a wavefront in a second direction of light passed through the projection optical system; a focus detecting unit configured to detect focus positions in the first and second directions of the projection optical system; and a calculating unit configured to calculate wavefront aberration of the projection optical system on the basis of the measurement result of the interferometer and the detection result of the focus detecting unit.

Further features and aspects of the present invention will become apparent from the following description of exemplary embodiments with reference to the attached drawings.

DESCRIPTION OF THE EMBODIMENTS

Numerous exemplary embodiments, features and aspects of the present invention will now herein be described below with reference to the drawings.

General Aspects of the Embodiments

Figure 1:
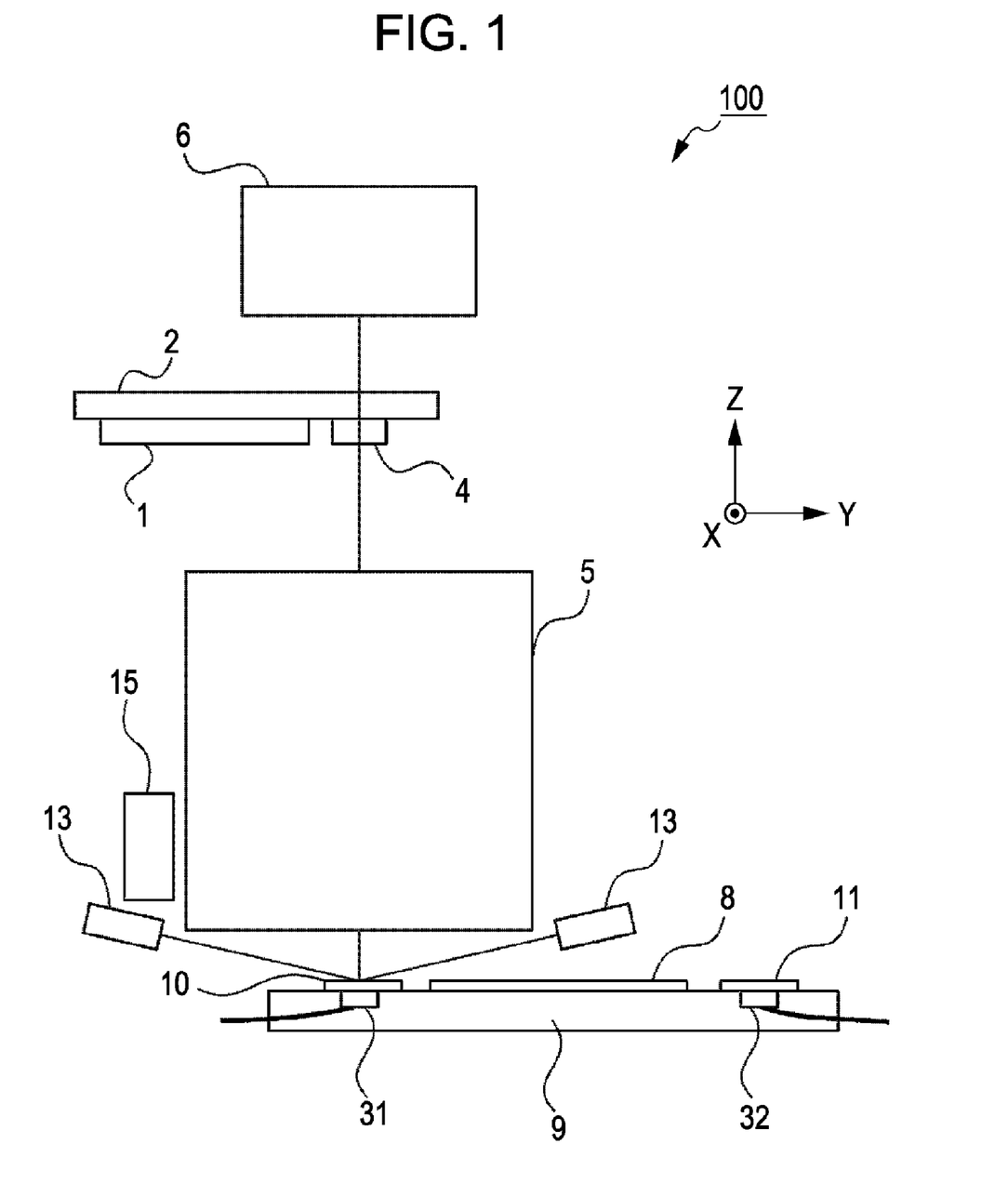
FIG. 1 is a schematic diagram of an example exposure apparatus according to an exemplary embodiment of the present invention.

FIG. 1 schematically illustrates an example projection exposure apparatus 100. The projection exposure apparatus 100 transfers a pattern of a reticle 1 serving as an original onto a wafer 8 serving as a substrate by exposure. The projection exposure apparatus 100 includes an illuminator 6, a projection optical system 5, a reticle stage (original stage) 2, and a wafer stage (substrate stage) 9. The projection exposure apparatus 100 also includes a surface-position detecting system 13 that detects the position of the surface of the wafer 8, and an off-axis alignment scope 15 that detects an alignment mark on the wafer 8.

The projection exposure apparatus 100 according to this embodiment is an exposure apparatus that performs an exposure process without having liquid between the projection optical system 5 and the wafer 8. Alternatively, the present invention is also applicable to an immersion exposure apparatus that performs an exposure process by having liquid filled between the projection optical system 5 and the wafer 8. The projection exposure apparatus 100 is a scan-type exposure apparatus which applies a step-and-scan method to transfer a pattern image of the reticle 1 onto the wafer 8 by exposure.

In the description below, the positional relationships among components will be explained while referring to an XYZ orthogonal coordinate system shown in FIG. 1. In this XYZ orthogonal coordinate system, the X-axis direction and the Y-axis direction are set orthogonally to the optical axis of the projection optical system 5, and the Z-axis direction is set parallel to the optical axis of the projection optical system 5. In this case, the Y-axis direction is the scanning direction.

The illuminator 6 includes an ArF excimer laser serving an exposure light source that emits exposure light with a wavelength of 193 nm. Although an exposure apparatus equipped with an ArF-excimer-laser exposure light source is described here as an example, the exposure light source may alternatively be defined by a mercury lamp, a KrF excimer laser (248 nm), or an EUV light source. The light emitted from the exposure light source is shaped into a desired shape, coherency, and polarization state at the illuminator 6 before being emitted to the reticle 1. The light is then diffracted by a fine circuit pattern formed on the reticle surface and is projected onto the wafer 8 disposed on the wafer stage 9 by the projection optical system 5.

A light-amount detecting TTR system and an image detecting TTR system serving as a focus detecting unit equipped in the projection exposure apparatus 100 will now be described.

Figure 2:
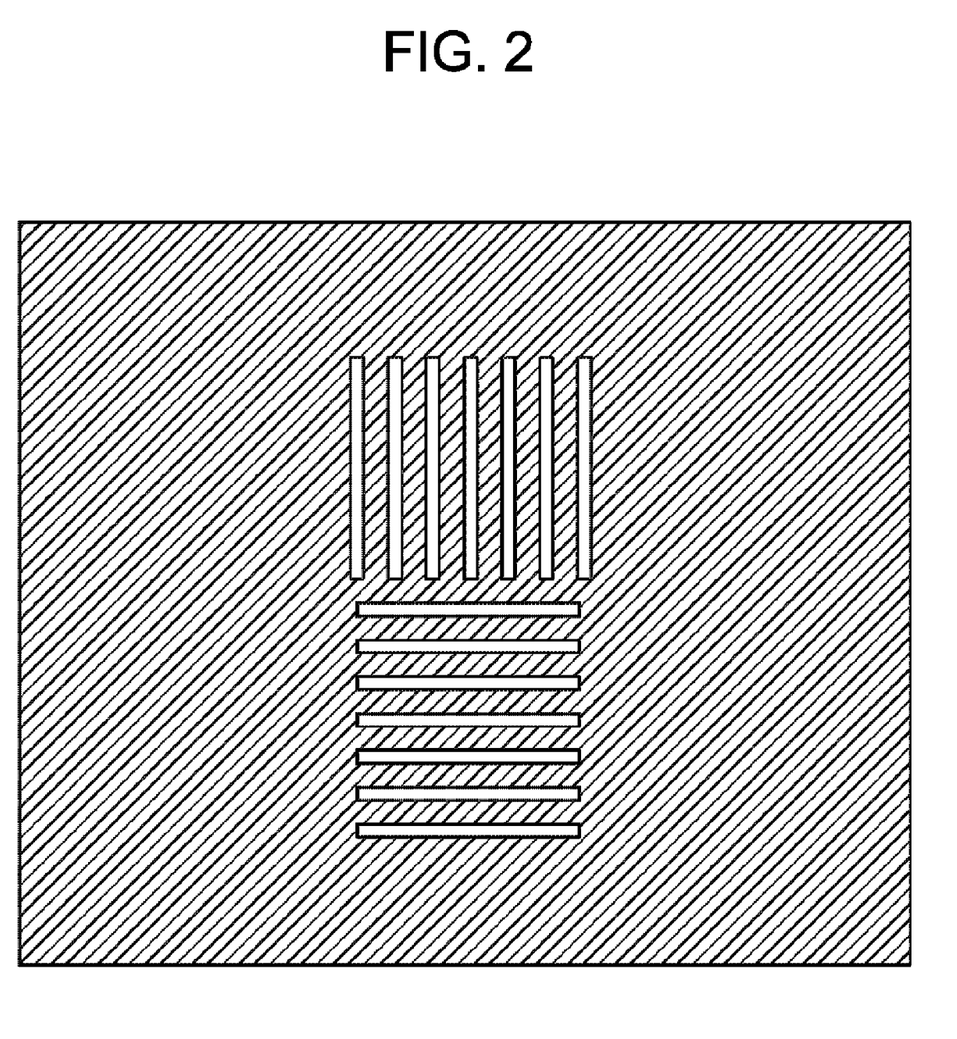
FIG. 2 schematically illustrates an example alignment mark (first mark, second mark).

The light-amount detecting TTR system is a through-the-reticle (TTR) detecting system that applies a light-amount detection method and is equipped in the exposure apparatus 100. The light-amount detecting TTR system will be described below with reference to FIG. 1. A reticle reference plate 4 disposed on the reticle 1 or the reticle stage 2 holding the reticle 1 is provided with an alignment mark (which will be referred to as a "first mark" hereinafter). A wafer reference plate 11 disposed on the wafer stage 9 holding the wafer 8 is also provided with an alignment mark (which will be referred to as a "second mark" hereinafter). As shown in FIG. 2, the first mark and the second mark are constituted by repetitive patterns of light-shielding portions and light-transmitting portions. The first mark and the second mark differ in size by an amount corresponding to the magnification of the projection optical system 5. The illuminator 6 illuminates the first mark, and the image of the first mark is projected onto the second mark provided on the wafer reference plate 11 through the projection optical system 5. While the wafer stage 9 or the reticle stage 2 is driven, a light-receiving unit 32 detects the light transmitted through the second mark on the wafer reference plate 11. Based on a change in the light amount caused when the stage is driven in the optical-axis direction of the projection optical system 5, a focus position of the projection optical system 5 is detected. On the other hand, based on a change in the light amount caused when the stage is driven in a direction orthogonal to the optical axis of the projection optical system 5, a relative position between the reticle 1 or the reticle stage 2 and the wafer stage 9 on a plane orthogonal to the optical axis can be detected.

Figure 4:
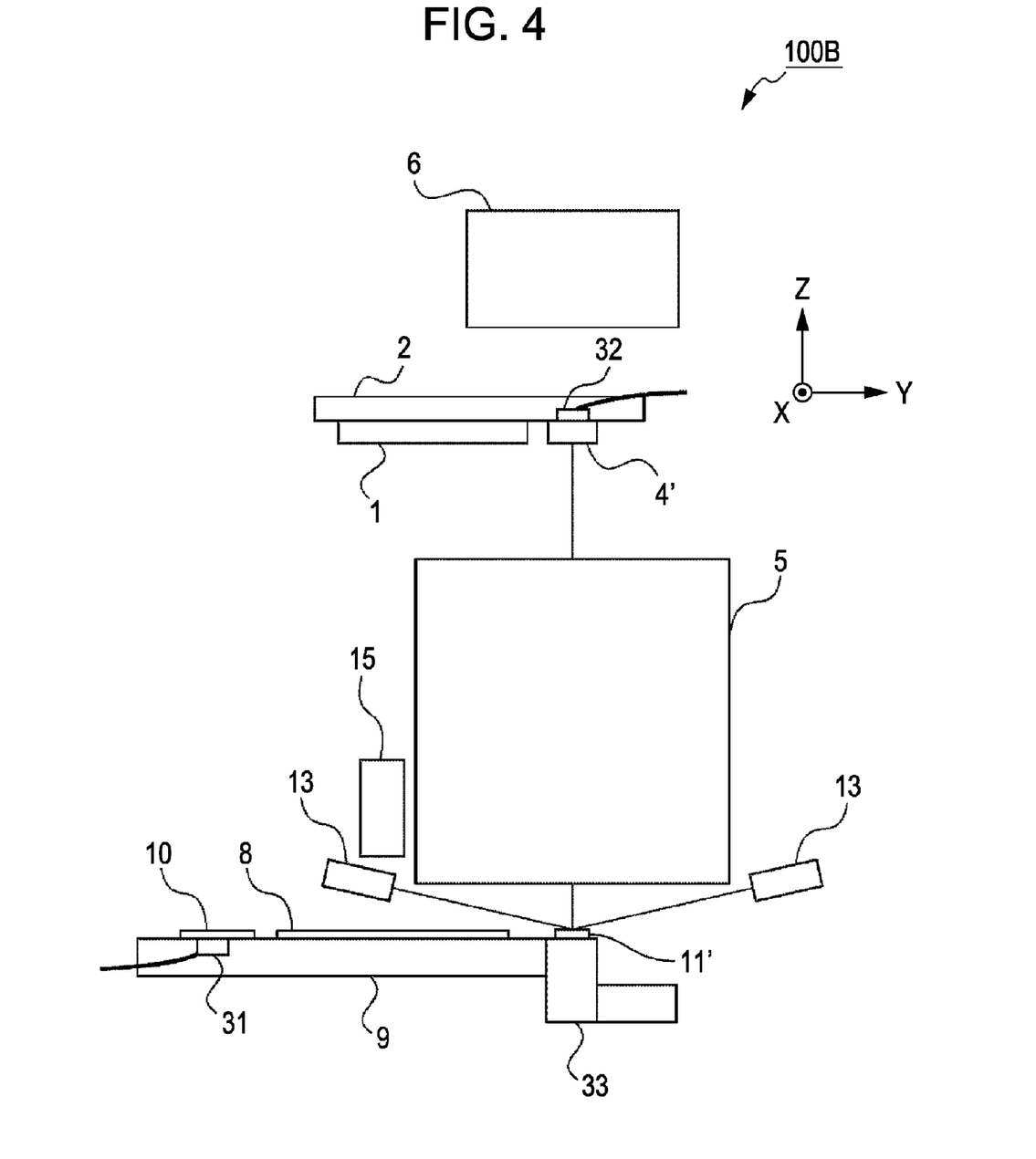
FIG. 4 is a schematic diagram of an example exposure apparatus according to a second embodiment of the present invention.

The light-amount detecting TTR system may alternatively have a configuration as shown in FIG. 4. Specifically, the light-amount detecting TTR system may be configured to illuminate the second mark from below a wafer reference plate 11' (i.e. from the opposite side of the projection optical system 5) and to form the image of the second mark on the first mark via the projection optical system 5 so as to detect the light transmitted through the alignment mark on a reticle reference plate 4'.

In place of or in addition to the light-amount detecting TTR system, the exposure apparatus may be equipped with an image detecting TTR system as a focus detecting unit, which is a TTR system that applies an image detecting method. An image detecting TTR system 14 will be described below with reference to FIG. 3. The image detecting TTR system 14 includes an objective lens 21, a relay lens 22, an illumination system 23, and an image pickup element 24. The objective lens 21 and the relay lens 22 are a magnifying optical system that can magnify an alignment mark (referred to as a "first mark" hereinafter) provided on the reticle 1 or the reticle reference plate 4 and form an image on the image pickup element 24. An image of an alignment mark (referred to as a "second mark" hereinafter) provided on the wafer 8 or the wafer reference plate 11 can also be formed on the image pickup element 24 through the projection optical system 5 and the magnifying optical system. Based on the images of the first mark and the second mark formed on the image pickup element 24, a relative position between the reticle 1 or the reticle stage 2 and the wafer 8 or the wafer stage 9 on a plane orthogonal to the optical axis can be detected. In a state where the magnifying optical system is focused on the first mark, the focus position of the projection optical system 5 can be detected by measuring a change in the contrast of the image of the second mark picked up when the wafer stage 9 is driven in the optical-axis direction of the projection optical system 5.

Figure 5:
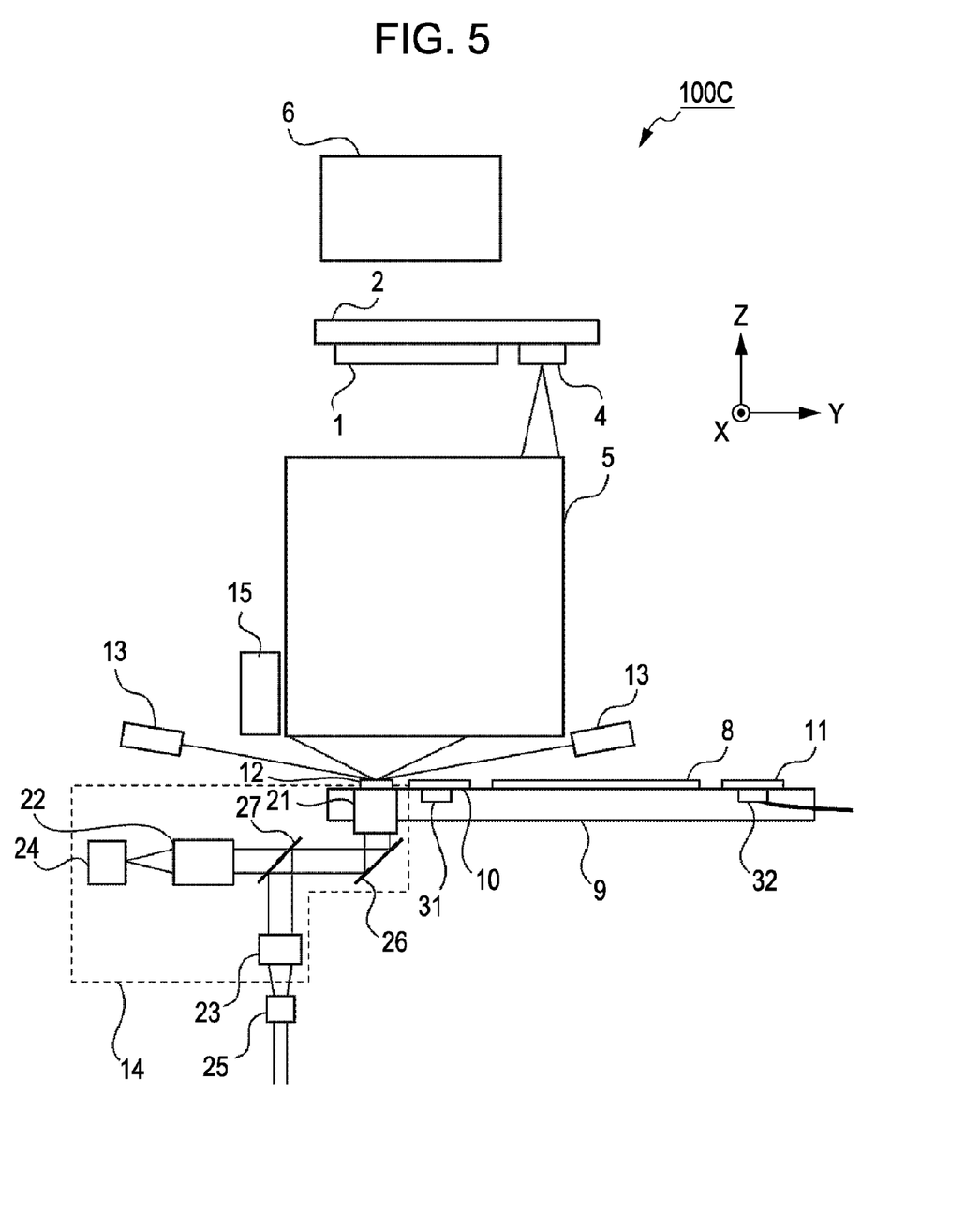
FIG. 5 is a schematic diagram of an example exposure apparatus according to a third embodiment of the present invention.

The image detecting TTR system may alternatively have a configuration as shown in FIG. 5.

An embodiment for measuring the wavefront aberration of the projection optical system 5 will now be described.

The reticle 1 or the reticle reference plate 4 on the reticle stage 2 has disposed thereon a first mark as an alignment mark and an LDI slit pattern (referred to as an "LDI-R mark" hereinafter). A wafer reference plate 10 on the wafer stage 9 has disposed thereon an LDI slit pattern (referred to as an "LDI-W mark" hereinafter), and the wafer reference plate 11 has disposed thereon a second mark as an alignment mark. In order to align the LDI-R mark with the LDI-W mark, the light-amount detecting TTR system is used. The light-amount detecting TTR system first allows the illuminator 6 to illuminate the alignment mark (first mark) which is constituted by repetitive patterns of light-transmitting portions and light-shielding portions on the reticle 1 or the reticle reference plate 4. The alignment mark used has a repetitive pattern extending in the X-axis direction and a repetitive pattern extending in the Y-axis direction. Light transmitted through the alignment mark travels through the projection optical system 5 so as to form an image on the alignment mark (second mark) disposed on the wafer reference plate 11 on the wafer stage 9. The light-receiving unit 32 detects the amount of transmitted light. In this case, the alignment in the X-axis and Y-axis directions is implemented on the basis of light-amount distribution obtained by scanning the wafer stage 9 in the X-axis and Y-axis directions. The focus position of the projection optical system 5 is detected on the basis of light-amount distribution obtained by scanning the wafer stage 9 in the Z-axis direction, whereby the alignment in the Z-axis direction is implemented.

In accordance with the positional relationship between the wafer reference plates 10 and 11 on the wafer stage 9 measured in advance by the off-axis alignment scope 15 and the surface-position detecting system 13, the reticle stage 2 and the wafer stage 9 are driven so that the alignment between the LDI-R mark and the LDI-W mark is completed.

After the alignment is completed, wavefront measurement is implemented. The exposure apparatus 100 according to this embodiment measures a wavefront that has passed through the projection optical system 5 by using a line diffraction interferometer constituted by the illuminator 6, the LDI-R mark, the LDI-W mark, and a CCD camera 31 serving as an image pickup element. The apparatus 100 further includes a light-receiving unit 32 positioned underneath reference plate 11 which detects transmitted light. As mentioned above, in this embodiment, a wavefront is measured at each of the X-axis and Y-axis slit patterns (LDI marks) to perform first-order wavefront measurement for each of the X-axis and Y-axis directions.

In this case, correction is performed by first calculating the astigmatism of the projection optical system 5 from the focus positions of the projection optical system 5 in the X-axis and Y-axis directions detected by the light-amount detecting TTR system, and then replacing the calculated astigmatism with lower-order astigmatism (such as a fifth term of a Zernike polynomial) of the wavefront aberration calculated from the measurement result of the LDI.

As an alternative to the above correction method, another correction method may be applied in which a wavefront is generated from astigmatism calculated based on the focus positions of the projection optical system 5 in the X-axis and Y-axis directions detected by the light-amount detecting TTR system, and then an image picked up by the CCD camera of the LDI is corrected. In either case, the correction is executed by a computer (calculating unit) included in the exposure apparatus.

The aforementioned measurement is performed at multiple positions within the exposure region of the projection optical system 5 so that wavefront aberration at various image heights can be obtained. At the same time, the distortion and the magnification of the projection optical system 5 can be calculated on the basis of positional measurement within the exposure region performed by the light-amount detecting TTR system, whereby the optical performance of the projection optical system 5 can be measured within a short period of time.

This embodiment is also applicable to an exposure apparatus of a twin stage type. A twin-stage exposure apparatus is an exposure apparatus having two wafer stages that are capable of holding wafers. A twin-stage exposure apparatus has a measurement station for determining the planar shape of the wafers and for measuring the position of the wafers, and an exposure station used for performing an exposure process on the wafers with exposure light from the projection optical system 5. The description below will be directed only to components of a twin-stage exposure apparatus that are necessary for explaining the present embodiment.

The measurement station is constituted by a surface-position detecting system 13 and an off-axis alignment scope 15 and is capable of measuring the positional relationship between the wafer reference plates 10 and 11.

When the measurement is completed, the wafer stage 9 moves to the exposure station. At the exposure station, the light-amount detecting TTR system aligns the reticle mark and the wafer mark with each other through the projection optical system 5. Subsequently, the stage 9 is driven so that the alignment with respect to the LDI marks is completed.

Although this embodiment is described with reference to an example where an LDI is used for measuring wavefront aberration, the present invention is applicable to all wavefront-aberration measurement methods used for calculating a synthesized wavefront from first-order wavefronts in two or more directions.

First Exemplary Embodiment

Figure 3:
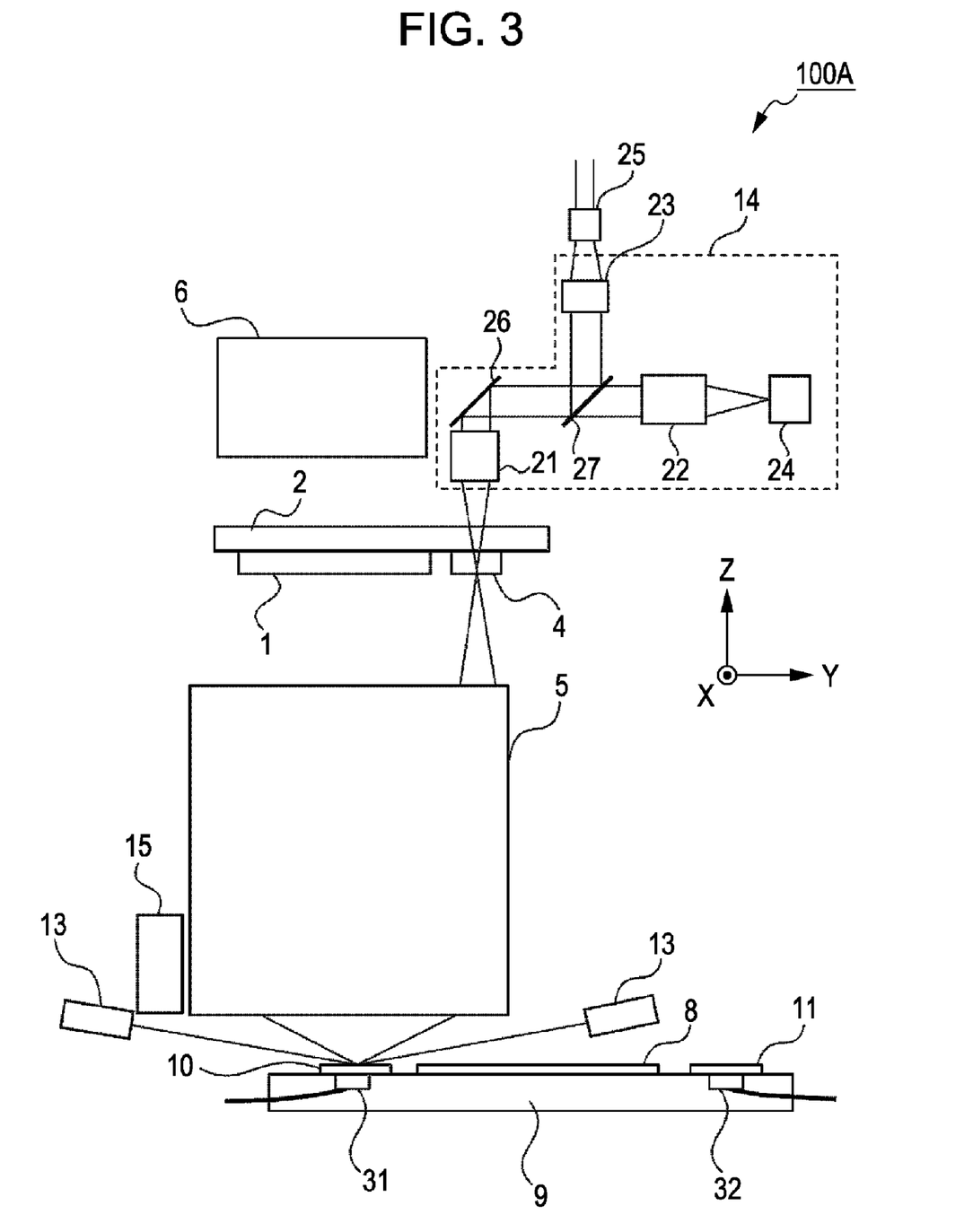
FIG. 3 is a schematic diagram of an example exposure apparatus according to a first embodiment of the present invention.

FIG. 3 is a schematic diagram of an example exposure apparatus 100A according to a first embodiment of the present invention. The differences from the above-described exemplary embodiment will be mainly described below.

The first embodiment differs from the above-described exemplary embodiment in that positional measurement is performed using an image detecting TTR system in place of a light-amount detecting TTR system.

In an image detecting method, a fiber 25 is used to guide laser light from a light source to the image detecting TTR system 14, and the illumination system 23, half mirror 27, mirror 26, and the objective lens 21 are used to guide the light to the alignment mark on the reticle 1 or the reticle reference plate 4. The light reflected by the light-shielding portions of the alignment mark returns to the image detecting TTR system 14 and travels through the relay lens 22 so as to form an image on the image pickup element 24. On the other hand, the light transmitted through the light-transmitting portions of the alignment mark travels through the projection optical system 5 and is reflected at the wafer reference plate 11 having an alignment mark. The reflected light then returns to the image detecting TTR system 14 and travels through the relay lens 22 so as to form an image on the image pickup element 24. These two rays of light are simultaneously observed at the image pickup element 24 where XYZ position measurement is implemented on the basis of the contrast and the position of the images. In this case, the alignment marks used each have a repetitive pattern having patterns arranged in the X-axis direction and a repetitive pattern having patterns arranged in the Y-axis direction, so that the focus positions in the X-axis and Y-axis directions can be detected.

Based on these determined X, Y, and Z measurement values, the LDI marks are aligned with each other so that the wavefront of the light passed through the projection optical system 5 can be measured using the LDI. The astigmatism of the projection optical system 5 is then calculated on the basis of the focus positions of the projection optical system 5 in the X-axis and Y-axis directions detected by the image detecting TTR system, and the measurement result of the LDI is corrected.

Second Exemplary Embodiment

FIG. 4 is a schematic diagram of an exposure apparatus 100B according to a second embodiment of the present invention. The differences from the above-described exemplary embodiment will be mainly described below.

In the light-amount detecting TTR system according to the second embodiment, the wafer stage 9 includes a projector system 33 that illuminates the alignment mark constituted by repetitive patterns of light-shielding portions and light-transmitting portions on the wafer reference plate 11'. The light transmitted through the alignment mark travels through the projection optical system 5 so as to form an image on the alignment mark disposed on the reticle reference plate 4' on the reticle stage 2. The transmitted light is then detected by the light-receiving unit 32. In this case, the alignment in the X-axis and Y-axis directions is implemented on the basis of light-amount distribution obtained by scanning the wafer stage 9 in the X-axis and Y-axis directions. The alignment in the Z-axis direction is implemented on the basis of light-amount distribution obtained by scanning the wafer stage 9 in the Z-axis direction. Based on a detection result of focus positions obtained using the repetitive pattern having patterns arranged in the X-axis direction and the repetitive pattern having patterns arranged in the Y-axis direction, the measurement result of the LDI is corrected.

Third Exemplary Embodiment

FIG. 5 is a schematic diagram of an example exposure apparatus 100C according to a third embodiment of the present invention. The differences from the above-described exemplary embodiment will be mainly described below.

Referring to FIG. 5, in the third embodiment, the image detecting TTR system 14 is provided closer to the wafer 8. The image detecting TTR system 14 illuminates a wafer reference plate 12 from the wafer side. The light is transmitted through the light-transmitting portions of an alignment mark on the wafer reference plate 12, passes through the projection optical system 5, and is reflected by the alignment mark on the reticle reference plate 4. On the other hand, the light is also reflected by the light-shielding portions of the alignment mark on the wafer reference plate 12. These two rays of reflected light are received by the image pickup element 24. While the wafer stage 9 is driven, these two rays of light are simultaneously observed and XYZ measurement is performed on the basis of positional shift and the contrast. In this case, the alignment marks used each have a repetitive pattern having patterns arranged in the X-axis direction and a repetitive pattern having patterns arranged in the Y-axis direction, so that the focus positions in the X-axis and Y-axis directions can be detected.

The wafer reference plates 10 and 12 may be separate components as in the third embodiment or may be defined by a single component.

Fourth Exemplary Embodiment

Figure 6:
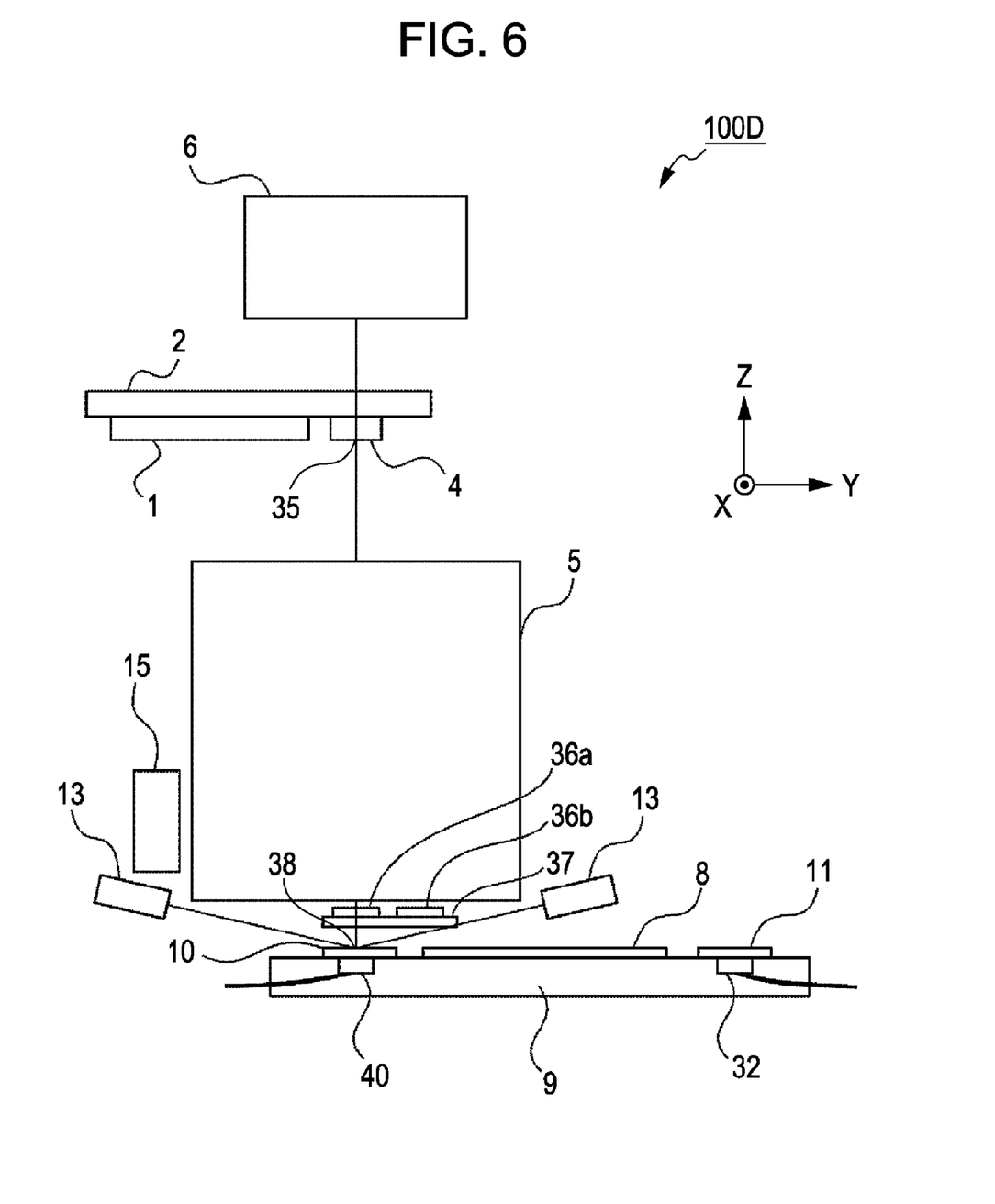
FIG. 6 is a schematic diagram of an example exposure apparatus according to a fourth embodiment of the present invention.

FIG. 6 is a schematic diagram of an exposure apparatus 100D according to a fourth embodiment of the present invention. The differences from the above-described exemplary embodiment will be mainly described below.

In the fourth embodiment, a shearing interferometer is used as the interferometer equipped in the exposure apparatus 100D.

The reticle 1 or the reticle reference plate 4 on the reticle stage 2 has a pin hole 35. The wafer reference plate 10 on the wafer stage 9 has an order selection window 38. The wafer stage 9 has an image pickup element 40. The projection optical system 5 and the wafer reference plate 10 have interposed therebetween diffraction-grating holding member 37 that holds diffraction gratings 36a and 36b. For the alignment between the pin hole 35 and the order selection window 38, the above-described light-amount detecting TTR system or image detecting TTR system can be used. FIG. 6 illustrates an example where a light-amount detecting TTR system is used.

Since first-order wavefronts of at least two orthogonal directions are measured in a shearing interferometer, the wavefront of light passed through the projection optical system 5 is measured by performing alignment of the diffraction grating 36 and the order selection window 38 in two directions. In this case, the focus positions of the projection optical system 5 in the X-axis and Y-axis directions are detected by the above-described method, and lower-order astigmatism of the projection optical system 5 is calculated on the basis of the detection result so that the measured value of the shearing interferometer can be corrected.

This correction may be implemented by replacement with a lower-order astigmatism value of the wavefront aberration of the projection optical system 5 determined from the measured value of the shearing interferometer, or by generating a wavefront from astigmatism and then correcting an image picked up by the image pickup element 40 of the shearing interferometer.

By performing this measurement at multiple positions within the exposure region of the projection optical system 5, wavefront aberration at various image heights can be obtained. At the same time, the distortion and the magnification of the projection optical system 5 can be calculated on the basis of positional measurement within the exposure region performed by the light-amount detecting TTR system, whereby the optical performance of the projection optical system 5 can be measured within a short period of time.

In the above embodiments, when the wavefront aberration of a projection optical system is to be measured in a projection exposure apparatus by using a line diffraction interferometer or a shearing interferometer, the astigmatism is measured in a part other than the interferometer. Based on this measurement result, the measurement result of the line diffraction interferometer or the shearing interferometer is corrected. Thus, an error occurring from a Z-axis positional difference at the time of measurement of two first-order wavefronts can be corrected, whereby the wavefront aberration of the entire pupil plane of the projection optical system can be measured with high accuracy.

Exemplary Device Manufacturing Method

Figure 7:
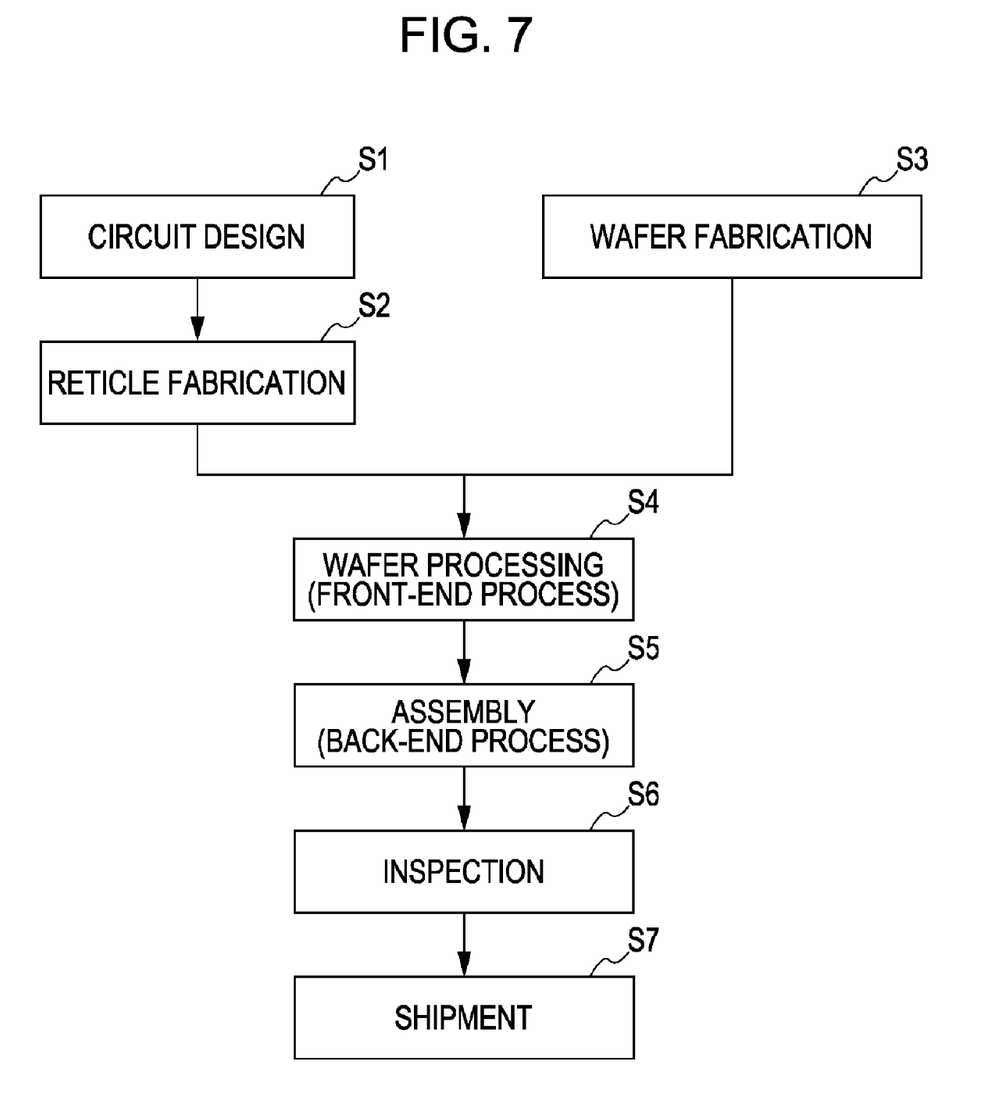
FIG. 7 is a flow chart describing an example device manufacturing method.
Figure 8:
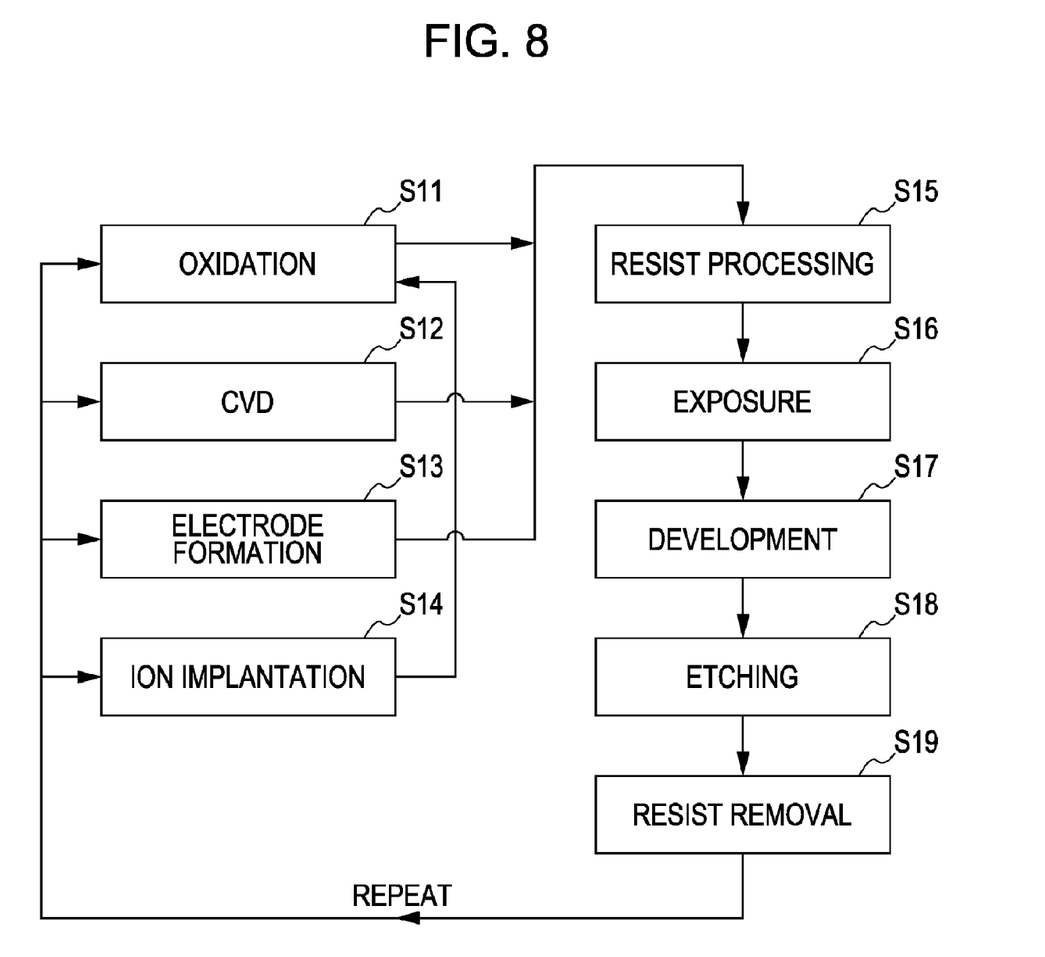
FIG. 8 is a detailed flow chart of a wafer processing step.

Referring to FIGS. 7 and 8, an embodiment of a device manufacturing method using the aforementioned exposure apparatus will be described below. FIG. 7 is a flow chart illustrating a method for manufacturing a device. Here, a method for manufacturing a semiconductor chip will be described as an example. Specifically, step S1 is a circuit design step for designing a circuit pattern of semiconductor chips. Step S2 is a reticle fabrication step for fabricating a reticle on the basis of the designed circuit pattern. Step S3 is a wafer fabrication step for fabricating a wafer using a material such as silicon. Step S4 is a wafer processing step, which is referred to as a front-end process. In this step, actual circuits are formed on the wafer by lithography using the reticle and wafer. Step S5 is an assembly step, which is referred to as a back-end process. In this step, semiconductor chips are formed from the wafer obtained in step S4. Specifically, this step S5 includes an assembly process (dicing and bonding) and a packaging process (chip sealing). Step S6 is an inspection step for testing the semiconductor chips obtained in step S5 for, for example, operation and durability. The semiconductor chips are thus completed through the above steps, and are subsequently shipped in step S7.

FIG. 8 is a detailed flow chart of the aforementioned wafer processing step S4. Specifically, step S11 is an oxidation step where the surface of the wafer is oxidized. Step S12 is a CVD step for forming an insulating film on the surface of the wafer. Step S13 is an electrode formation step for forming electrodes on the wafer by vapor deposition. Step S14 is an ion implantation step for implanting ions into the wafer. Step S15 is a resist processing step for applying a photosensitive agent onto the wafer. Step S16 is an exposure step for printing the circuit pattern of the reticle onto the wafer by exposure using the above-described exposure apparatus. Step S17 is a development step where the exposed wafer is developed. Step S18 is an etching step for etching away parts other than the developed resist image. Step S19 is a resist removal step for removing the resist that has become unnecessary after the etching step. By repeating these steps, a multilayer circuit pattern is formed on the wafer. According to the device manufacturing method of this embodiment, devices (such as semiconductor devices and liquid crystal devices) can be manufactured to higher levels of quality than before.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

According to the present invention, wavefront aberration of a projection optical system can be measured with high accuracy in a projection exposure apparatus equipped with an interferometer.

This application claims the benefit of Japanese Application No. 2007-109576 filed Apr. 18, 2007, which is hereby incorporated by reference herein in its entirety.

What is claimed is:

1. An exposure apparatus equipped with a projection optical system configured to project a pattern of an original onto a substrate, the exposure apparatus comprising:
    an interferometer configured to measure a wavefront in a first direction and a wavefront in a second direction of light passed through the projection optical system;
    a focus detecting unit configured to detect focus positions in the first and second directions of the projection optical system; and
    a calculating unit configured to calculate wavefront aberration of the projection optical system on the basis of the measurement result of the interferometer and the detection result of the focus detecting unit.

2. The exposure apparatus according to claim 1, wherein the calculating unit calculates astigmatism of the projection optical system on the basis of the detection result of the focus detecting unit.

3. The exposure apparatus according to claim 1, wherein the calculating unit corrects the wavefront aberration of the projection optical system, calculated from the measurement result of the interferometer, on the basis of the detection result of the focus detecting unit.

4. The exposure apparatus according to claim 1, wherein the calculating unit corrects the measurement result of the interferometer on the basis of a wavefront generated from the detection result of the focus detecting unit.

5. The exposure apparatus according to claim 1, further comprising:
    an original stage configured to hold the original; and
    a substrate stage configured to hold the substrate,
    wherein the focus detecting unit includes a light-receiving unit configured to detect an amount of light passed through a first mark disposed on the original stage or the original and a second mark disposed on the substrate stage.

6. The exposure apparatus according to claim 1, further comprising:
    an original stage configured to hold the original; and
    a substrate stage configured to hold the substrate,
    wherein the focus detecting unit includes an image pickup element configured to detect an image of a first mark disposed on the original stage or the original and an image of a second mark disposed on the substrate stage or the substrate, and
    wherein the image of one of the first mark and the second mark is formed on the image pickup element by passing through the projection optical system, and the image of the other one of the first mark and the second mark is formed on the image pickup element without passing through the projection optical system.

7. The exposure apparatus according to claim 1, wherein the calculating unit calculates at least one of distortion and magnification of the projection optical system on the basis of the detection result of the focus detecting unit.

8. The exposure apparatus according to claim 1, wherein the interferometer comprises a line diffraction interferometer or a shearing interferometer.

9. A device manufacturing method utilizing an exposure apparatus equipped with a projection optical system configured to project a pattern of an original onto a substrate, the apparatus including an interferometer configured to measure a wavefront in a first direction and a wavefront in a second direction of light passed through the projection optical system; a focus detecting unit configured to detect focus positions in the first and second directions of the projection optical system; and a calculating unit configured to calculate wavefront aberration of the projection optical system on the basis of the measurement result of the interferometer and the detection result of the focus detecting unit, the method comprising:
    exposing a substrate to light using the exposure apparatus; and
    developing the exposed substrate.

* * * * *